US006488272B1

(12) United States Patent
Nguyen

(10) Patent No.: US 6,488,272 B1
(45) Date of Patent: Dec. 3, 2002

(54) LIQUID DELIVERY SYSTEM EMULSIFIER

(75) Inventor: Tue Nguyen, Fremont, CA (US)

(73) Assignee: Simplus Systems Corporation, Fremont, CA (US)

( * ) Notice: Subject to any disclaimer, the term of this patent is extended or adjusted under 35 U.S.C. 154(b) by 0 days.

(21) Appl. No.: 09/589,632

(22) Filed: Jun. 7, 2000

(51) Int. Cl.[7] .................................................. B01F 3/04

(52) U.S. Cl. ......................... 261/152; 261/28; 261/78.2

(58) Field of Search .............................. 261/28, 66, 76, 261/78.2, 116, 127, 152

(56) References Cited

U.S. PATENT DOCUMENTS 3,524,630 A * 8/1970 Marion ...................... 261/78.2
3,689,237 A * 9/1972 Stark et al. ................ 261/78.2
3,761,066 A * 9/1973 Wheeler .................... 261/78.2
4,131,658 A * 12/1978 Hirata et al. ............... 261/78.2
4,284,590 A * 8/1981 Deboer, Jr. et al. ........ 261/78.2
4,919,853 A * 4/1990 Alvarez et al. ............ 261/78.2
5,004,484 A * 4/1991 Stirling et al. .............. 261/152
5,056,511 A * 10/1991 Ronge ....................... 261/78.2
5,176,325 A * 1/1993 Vidusek ..................... 261/78.2
5,372,754 A * 12/1994 Ono .......................... 261/78.2

* cited by examiner

*Primary Examiner*—C. Scott Bushey

(57) ABSTRACT

A precursor delivery system emulsifier is provided for delivery a mixture of liquid and gas precursors. Since the liquid precursor is mixed with a gas, the flow pattern of the emulsified precursor can be controlled and modified and the relatively large flow rate of the emulsified precursor prevents the line from being clogged. Further, the mixing of the liquid precursor and gas at a site outside the vaporization chamber permits the liquid precursor line to remain cool, so that even the small diameter line remains unclogged.

20 Claims, 4 Drawing Sheets

LIQUID DELIVERY SYSTEM EMULSIFIER

FIELD OF THE INVENTION

The present invention relates generally to apparatus for processing of a semiconductor wafer, and more particularly to a system to transform liquid precursors into emulsified liquid precursors for delivery to a processing system.

BACKGROUND OF THE INVENTION

Conventional chemical vapor deposition (CVD) processes use vapor precursors for the deposition of thin films on an IC substrate. To broaden the processes, more and more liquid and solid precursors have been used, especially in the area of metal-organic chemical vapor deposition (MOCVD). To perform this task, a liquid precursor is typically turned to vapor, and the vapor is then decomposed on the substrate. A solid precursor must often be dissolved into a solvent to form a liquid precursor. Then, the liquid precursor needs to be converted into vapor phase before introduction into the deposition zone.

Basic components of a liquid precursor vaporization system is the liquid delivery system and the vaporizer. The liquid delivery system carries the liquid precursor from the liquid container to the vaporizer. The vaporizer converts the liquid precursor into vapor form before deliver on the substrate. A carrier gas is normally used in the vaporizer to carry the precursor vapor to the substrate. In some applications, a gas precursor could take place of the carrier gas, performing the carrying function together with the precursor function.

Some conventional vaporizers use large extended heated surfaces. While these surfaces do provide heat to vaporize liquid reagents, they are not necessarily efficient, as the heating surfaces extend in only two dimensions. The surface area can be increased by roughing the surface or minimizing the through passages through the plate. Simply increasing the surface area, however, does not necessarily increase the rate of flow of vaporized precursor. A trade-off is generally made between heated surface area and high flow rates of vaporized precursor. That is, conventional heated surface areas may block vapor flow, preventing a high flow rate. High pressure on the input side of the vaporizer creates a high pressure differential from the input to the output, creating precursor vapor condensation. Large inlet pressures may also cause condensation of the vapor. Eventually, condensed liquid blocks the vaporizer output. Alternately, the heated surface area can be reduced to increase the vapor flow conductance. However, when too little heated surface is provided, insufficient liquid precursor is vaporized, and the liquid precursor will collect in the vaporizer and eventually block the output. The above-described trade-off can also be considered an issue of deposition rates vs. efficient use of precursor.

A related problem is in the delivery of the precursor to the vaporization a chamber. To control the flow of liquid precursor, the liquid delivery input port to the vaporization chamber is made small. Large input ports, or small ports under high pressure, introduce too much precursor so that the vaporization process is inefficient. However, small ports used at relatively low pressures have a tendency to fill with decomposing precursor, and eventually clog. This is due to the unstable nature of most precursors and the proximity of heat source used to vaporize the precursor. The system must be shut down, and the decomposed and partially decomposed material removed from the input port, before the vaporization process can continue.

Other problem concerns the distribution pattern of liquid precursor to the vaporization chamber. Small ports at low pressure will form large droplet into the vaporization surface. It is well known to use piezoelectric atomizer to break the liquid precursor into finer droplets at the input section of a vaporization chamber. However, there is still a tendency for the liquid precursor port to clog due to relatively narrow opening and the proximity of heat. Pressure type atomizers are also well known, to break a liquid into droplets by pushing the liquid through an opening, creating a spray. To compensate for the high pressure of the liquid, the spray opening is very small. In this manner an efficient amount of precursor is delivered. Despite the high pressure, the very small opening has a tendency to clog in the heated vaporization chamber environment.

It would be advantageous if a precursor delivery system could introduce liquid precursor to a vaporization chamber without clogging.

It would be advantageous if a precursor delivery system could introduce liquid precursor to a vaporization chamber using small diameter input port but without clogging.

It would be advantageous if a precursor delivery system could introduce liquid precursor to a vaporization chamber at a small droplets without an atomizer.

It would be advantageous if a liquid precursor delivery rate could be controlled for efficient use of precursor without using small diameter input ports or lines, which clog with precursor.

It would be advantageous if a precursor could be delivered in a form that permitted the use of large diameter input ports.

It would be advantageous if the liquid precursor could be introduced to the system in a low temperature environment, to prevent the clogging of the inlet line.

SUMMARY OF THE INVENTION

Accordingly, a precursor delivery system emulsifier to deliver liquid precursor for vaporization is provided. The invention takes the carrier gas from the vaporizer, normally used to carry the vaporized precursor from the vaporizer to the substrate, and brings it upstream to carry the liquid precursor from the liquid delivery line to the vaporizer. This way the liquid precursor includes a large volume of carrier gas for controlled delivery. The invention significantly minimizes the problem of the liquid delivery line clogging due to the unstable nature of the precursor. The carrier gas will carry the liquid to the vaporizer, essentially increase significantly the flow rate of the precursor without increasing the liquid flow rate, thus keeping the process results unchanged. The high flow rate reduces the time the liquid precursor stay in the liquid line, thus reducing the chance of decomposition or damage even with a small inside line diameter. With the higher flow rate, the line inside diameter could be enlarged, thus further reducing the chance of clogging. When the process is completed, the carrier gas will purge all the liquid out of the liquid line, thus eliminating all stagnant liquid that could be decomposing. The emulsifior could be located outside the vaporizer, thus reducing the flow of heat that could damage the heat-sensitive precursor. The emulsifior also modifies the flow pattern of the liquid delivery line to the vaporizer. Without the carrier gas mixing, the low flow rate of the liquid delivery line will cause the dripping from the liquid line. The liquid droplet is typical 1–2 mm diameter in size before dropping down because of the balance between gravity and flow versus the surface tension. In contrast, with the carrier gas, the droplet is much smaller because the gas flow destroys the surface tension. And the smaller droplets are not dripping but exploded into further smaller droplet in a wider pattern. In a way, the emulsifier acts as a liquid atomizer.

Alternatively, the carrier gas can be substituted with a gaseous precursor in the event that a gaseous precursor is needed together with a liquid precursor. Though described in conjunction with a vaporizer, the basic concept of the emulsifier is to carry the liquid/gas mixture to improve the liquid delivery system. As described above, the emulsifior can be used to change the spray pattern of the liquid.

The present invention provides a precursor delivery system emulsifier to mix a gas with a liquid in a ratio greater, or equal to, one to one. The emulsifier includes:

- a liquid input port to accept liquid precursor;
- a gas input port to accept a gas;
- an internal mixing chamber operatively connected to the liquid and gas input ports;
- an one-way means interposed between the liquid and gas input ports to minimize the flow of liquid precursor into the gas input port;
- an output port to provide an emulsified liquid/gas precursor, whereby the emulsified liquid/gas precursor outflow pattern is conditioned for maximum control.

The typical flow rate of the liquid precursor is in the range from 0.01 to 20 milliliters per minute, and the gas flow rate is in the range between 50 and 1000 cubic centimeters per minute. The typical inside diameter of the liquid precursor line is less than $\frac{1}{8}$ of an inch with a normal range of $\frac{1}{64}$"–$\frac{1}{32}$". The typical inside diameter of the gas line is less than $\frac{1}{4}$" with a normal range of $\frac{1}{128}$"–$\frac{1}{32}$". The inside diameters of the liquid and gas lines are selected based on the flow rates of the liquid and gas to achieve the emulsifying effect.

It is not easy for the gas to travel upstream of a liquid line, but liquid can easily travel upstream of a gas line. Therefore the emulsifior provides an one-way means between the liquid line and the gas line to minimize the capillary action of liquid in the gas line.

In some aspects of the invention, the one-way means is formed by having lower pressure at the output port than at the gas input port, whereby the liquid precursor flow is greater toward the output port, thus minimizing the liquid precursor flow into the gas input port.

In some aspects of the invention, the one-way means is formed by having smaller inside diameter at the gas input port, whereby the gas pressure is greater at the gas input port, thus minimizing the liquid precursor flow into the gas input port.

In some aspects of the invention, the one-way means is formed by having higher pressure at the gas input port than at the liquid input port, whereby the liquid precursor flow is greater toward the output port, thus minimizing the liquid precursor flow into the gas input port.

In some aspects of the invention, the one-way means is formed by having a porous membrane interposed between the gas port and the internal mixing chamber to encourage the passage of gas into said internal mixing chamber and to discourage the passage of liquid precursor out of the internal mixing chamber.

In some aspects of the invention, the one-way means is formed by having a check valve in the inlet stream of the gas precursor, whereby neither the liquid precursor nor the gas can flow back toward the gas input.

In the simplest form of the invention, the internal mixing chamber is a pipe tee with one tee inlet is the liquid input port, one tee inlet is the gas input port and one tee inlet is the output port. With multiple gas input ports, or multiple liquid input ports, the tee could be replaced by a cross, or a 5-way, 5-way connections. To minimize the liquid backflow to the gas inlet, the gas has a straight path from the gas input port to the output port and the branched tee inlet is the liquid inlet port. The optimum configuration includes the smallest inside diameter for the gas port, the liquid port has a larger inside diameter, and the output port has the largest inside diameter.

In some aspects of the invention, the emulsifier further includes a shut off valve at the liquid input port to shut off the liquid precursor flow, whereby the gas flow performs the cleaning of liquid precursor residue. The shut off valve could be integrated to the internal mixing chamber, whereby the dead volume of the liquid precursor is minimized.

In some aspects of the invention, the liquid precursor is CVD liquid precursor or MOCVD liquid precursor. This invention is most appropriate for MOCVD processes, such as copper deposition, diffusion barrier (titanium nitride, tantalum nitride, tungsten nitride, etc.) deposition, ferroelectric and high dielectric constant materials deposition, where the precursors are highly susceptible to heat.

In some aspects of the invention, the liquid and the gas input ports are concentric double wall inlet, whereby the liquid precursor flow in one input and the gas flow in the other input.

In some aspects of the invention, the emulsifior further includes a temperature means to adjust the temperature of the emulsifior, whereby the mixing process is conditioned for maximum control. For vaporization process, the emulsifier is heated to a temperature in the range between room temperature and 300 degrees Celsius, whereby the mixing process is furthered and the emulsified precursor is prepared for subsequent processes. For heat-sensitive precursor, the emulsifier is cooled to a temperature in the range between room temperature and −200 degrees Celsius to prevent degradation of the liquid precursor.

DETAILED DESCRIPTION OF THE PREFERRED EMBODIMENT

Figure 1:
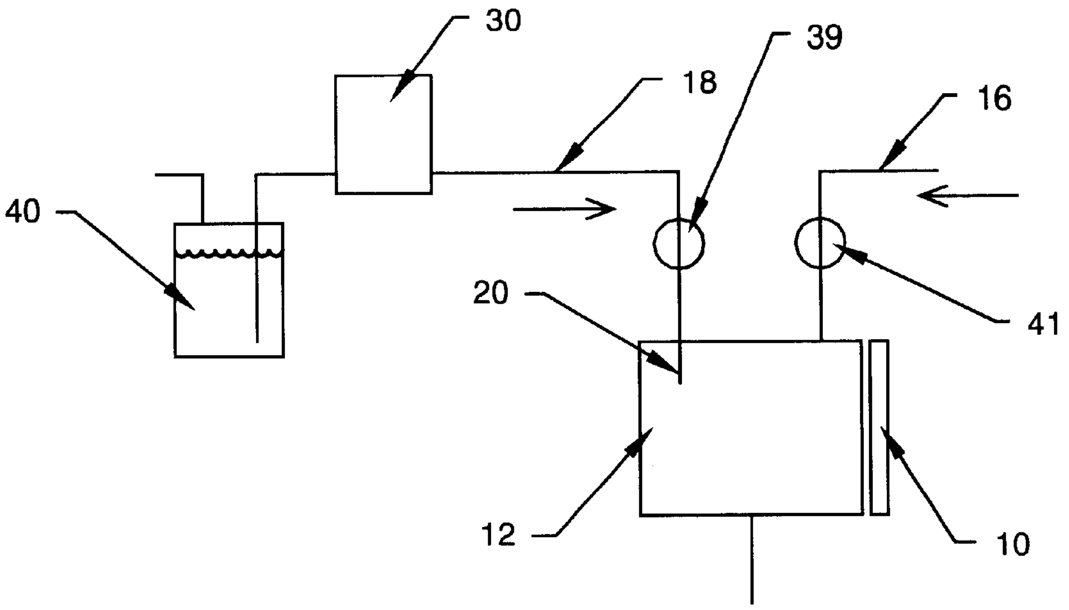
FIG. 1 shows a prior art liquid delivery system.

FIG. 1 shows a prior art liquid delivery system. The liquid is stored in the container 40, and is pushed out to the metering device 30. The liquid continues to travel in the line 18 to the vaporizer 12. Valve 39 is optional, used for stopping the liquid flow. The tip of the liquid line 20 is inside the vaporizer 12. Carrier gas flows from the line 16 to the vaporizer 12. Valve 41 is optional, used for stopping the carrier gas flow. Heater 10 heats the vaporizer to a vaporization temperature. The major disadvantage of this delivery system is the reliability of the liquid delivery line. A small line is desirable for small flow, but too easily clogged. Also the proximity of the heat source, in the case of heat-sensitive precursor, could cause precursor degradation.

Figure 2:
FIG. 2 shows a prior art liquid spray pattern.

FIG. 2 shows a prior art liquid spray pattern. When the droplet is large enough so that gravitational force is larger than the surface tension, the droplet is breaking free and dropped to the receiving surface. The major disadvantage of this spray pattern is the large droplet size, typical 1–2 mm in diameter. Also the spray is not uniform.

Figure 3:
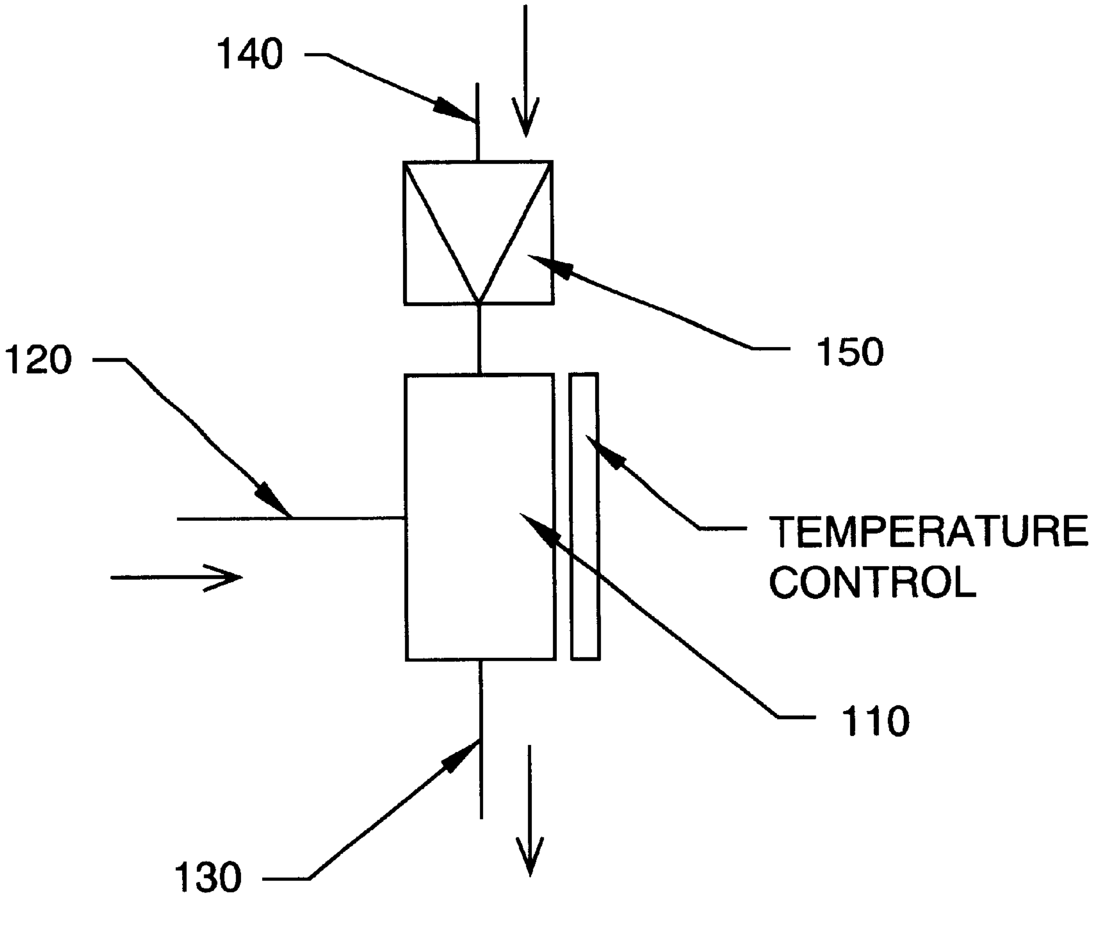
FIG. 3 shows the present invention liquid delivery system emulsifier.

FIG. 3 shows the present invention emulsifier. The emulsifier includes a mixing chamber 110 for mixing the liquid precursor 120 with the carrier gas 140. The emulsified precursor leaves the mixing chamber at the output port 130. The one-way valve 150 prevents the liquid from backflowing into the carrier gas 140 inlet.

Figure 4:
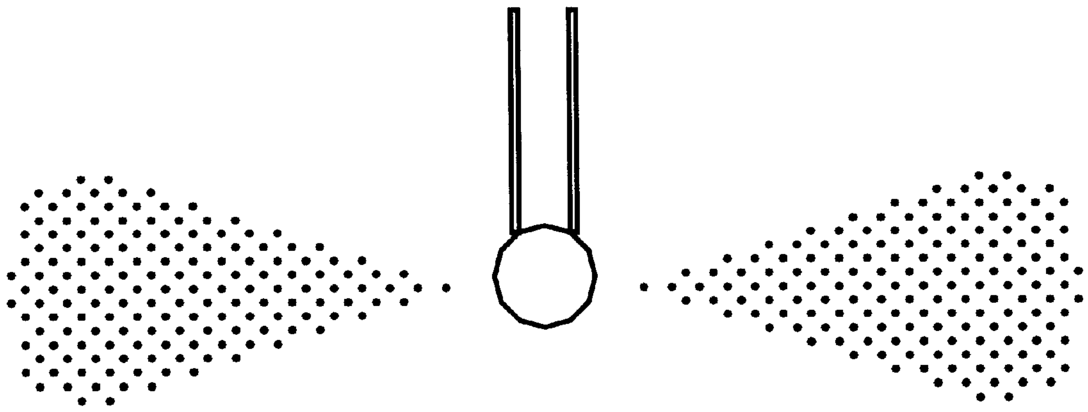
FIG. 4 shows the present invention emulsifier spray pattern.

FIG. 4 shows the spray pattern of the emulsifier. The liquid is accumulated at the tip of the line, and continues to grow. When the droplet is blocking the inside diameter of the line, the gas pressure increases and the droplet explodes. Before the explosion of the droplet, the droplet size is dependent on the inside diameter of the line, and is typically smaller than the droplet size needed for free falling. After the explosion, the droplet size is further smaller. The spray pattern is spread out toward a larger area.

What is claimed is:

1. A precursor delivery system emulsifior, to mix a gas with a liquid in a ratio greater, or equal to, one to one, the system comprising:

a liquid input port to accept liquid precursor;

a gas input port to accept a gas;

an internal mixing chamber operatively connected to the liquid and gas input ports;

an one-way means interposed between the liquid and gas input ports to minimize the flow of liquid precursor into the gas input port;

an output port to provide an emulsified liquid/gas precursor, whereby the emulsified liquid/gas precursor outflow pattern is conditioned such that when each droplet blocks an inside diameter of the liquid input port, gas pressure increases and the droplet explodes.

2. A system as in claim 1 in which the one-way means is formed by having lower pressure at the output port than at the gas input port, whereby the liquid precursor flow is greater toward the output port, thus minimizing the liquid precursor flow into the gas input port.

3. A system as in claim 1 in which the one-way means is formed by having smaller inside diameter at the gas input port, whereby the gas pressure is greater at the gas input port, thus minimizing the liquid precursor flow into the gas input port.

4. A system as in claim 1 in which the one-way means is formed by having higher pressure at the gas input port than at the liquid input port, whereby the liquid precursor flow is greater toward the output port, thus minimizing the liquid precursor flow into the gas input port.

5. A system as in claim 1 in which the one-way means is formed by having a porous membrane interposed between the gas port and the internal mixing chamber to encourage the passage of gas into said internal mixing chamber and to discourage the passage of liquid precursor out of the internal mixing chamber.

6. A system as in claim 1 in which the one-way means is formed by having a check valve in the inlet stream of the gas precursor, whereby neither the liquid precursor nor the gas can flow back toward the gas input.

7. A system as in claim 1 in which the internal mixing chamber is a pipe tee wherein one tee inlet is the liquid input port, one tee inlet is the gas inlet port and one tee inlet is the output port.

8. A system as in claim 7 in which the branched tee inlet is the liquid inlet port, whereby the gas has a straight path from the gas input port to the output port.

9. A system as in claim 1 further comprising a shut off valve at the liquid input port to shut off the liquid precursor flow, whereby the gas flow performs the cleaning of liquid precursor residue.

10. A system as in claim 9 in which the shut off valve is integrated to the internal mixing chamber, whereby the dead volume of the liquid precursor is minimized.

11. A system as in claim 1 in which the liquid precursor is CVD liquid precursor.

12. A system as in claim 1 in which the liquid precursor is MOCVD liquid precursor.

13. A system as in claim 1 in which the liquid and the gas input ports are concentric double wall inlet, whereby the liquid precursor flow in one input and the gas flow in the other input.

14. A system as in claim 1 in which the inside diameter of the liquid input port is sized to permit a liquid precursor flow rate into the internal chamber at a rate in the range from 0.01 to 20 milliliters per minute.

15. A system as in claim 1 in which the inside diameter of the gas input port is sized to permit a gas flow rate into the internal chamber at a rate in the range between 50 and 1000 cubic centimeters per minute.

16. A system as in claim 1 further comprising:

a heating or cooling means to adjust the temperature of the emulsifior, whereby the mixing process is conditioned for maximum control.

17. A system as in claim 16 in which the emulsifior is heated to a temperature in the range between room temperature and 300 degrees Celsius, whereby the mixing process is furthered and the emulsified precursor is prepared for subsequent processes.

18. A system as in claim 16 in which the emulsifior is cooled to a temperature in the range between room temperature and −200 degrees Celsius to prevent degradation of the liquid precursor.

19. A system as in claim 1 further comprising:

a plurality of liquid input ports.

20. A system as in claim 1 further comprising:

a plurality of gas input ports.

* * * * *